US007868312B2

(12) United States Patent
Sato

(10) Patent No.: US 7,868,312 B2
(45) Date of Patent: Jan. 11, 2011

(54) SEMICONDUCTOR MEMORY DEVICE AND MANUFACTURING METHOD THEREOF

(75) Inventor: Homare Sato, Tokyo (JP)

(73) Assignee: Elpida Memory, Inc., Chuo-ku, Tokyo (JP)

(*) Notice: Subject to any disclaimer, the term of this patent is extended or adjusted under 35 U.S.C. 154(b) by 719 days.

(21) Appl. No.: 11/785,535

(22) Filed: Apr. 18, 2007

(65) Prior Publication Data

US 2007/0246440 A1    Oct. 25, 2007

(30) Foreign Application Priority Data

Apr. 20, 2006   (JP)   .............................. 2006-116388

(51) Int. Cl.
*H01L 47/00*   (2006.01)
(52) U.S. Cl. ............ 257/4; 257/3; 257/2; 257/E31.029; 365/158; 365/171; 438/666
(58) Field of Classification Search ................ 257/2–5, 257/212, E31.029
See application file for complete search history.

(56) References Cited

U.S. PATENT DOCUMENTS 6,114,713 A * 9/2000 Zahorik .................... 257/4

6,150,253 A * 11/2000 Doan et al. ................ 438/597
2004/0012009 A1   1/2004 Casagrande et al.

OTHER PUBLICATIONS

E. Varesi, A. Modelli, P. Besana, T. Marangon, F. Pellizzer, A.Pirovano, R. Bez, "Advances in Phase Technology", EPCOS 2004 Conf. Proceedings.
S. Hudgens, B. Johnson, "Overview of Phase-Change Chalcogenide Nonvolatile Memory Technology", MRS Bulletin, Nov. 2004.

* cited by examiner

*Primary Examiner*—Thinh T Nguyen
(74) *Attorney, Agent, or Firm*—McGinn IP Law Group, PLLC

(57) ABSTRACT

A semiconductor memory device is provided in which a phase-change layer can be formed stably and electric current required to cause the phase change of the phase-change layer can be reduced. An edge portion of the phase-change layer is formed above a lower electrode. The edge portion is formed to assume a tapered shape in cross section such that the thickness of the phase-change layer varies above the contact area between the lower electrode and the phase-change layer. The tapered portion is filled with an oxide film. According to this configuration, the region in which the phase-change occurs can be restricted, and hence the phase-change layer can be heated efficiently, resulting in reduction of electric current required for heating.

20 Claims, 4 Drawing Sheets

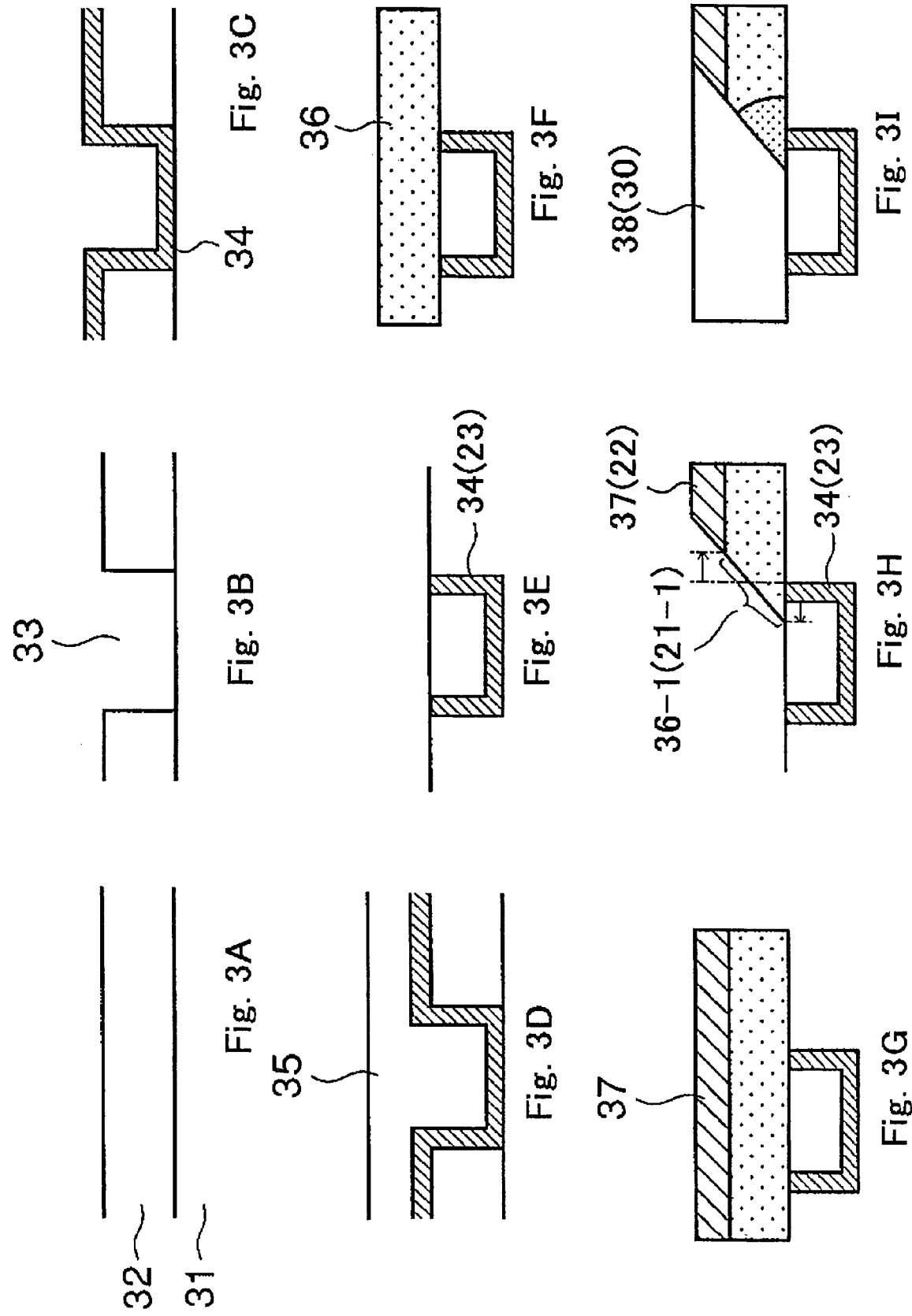

SEMICONDUCTOR MEMORY DEVICE AND MANUFACTURING METHOD THEREOF

This application claims priority to prior Japanese application JP 2006-116388, the disclosure of which is incorporated herein by reference.

BACKGROUND OF THE INVENTION

The present invention relates to a semiconductor memory device, in particular to a semiconductor memory device referred to as a phase-change type memory and a manufacturing method thereof.

Recently, a phase-change random access memory (PRAM) has been proposed as a semiconductor memory an alternative to DRAM. The PRAM uses a phase change material for a recording layer to record information.

The phase change material is able to freely transit between a crystal state and an amorphous state according to heat conditions. The phase change material has an electric resistance value in the crystal state that is significantly different from that in the amorphous state. Utilizing such properties of the phase change material, the PRAM stores data by changing the phase state of the phase change material according to the data to be stored.

Data writing to the PRAM is performed by supplying electric current according to the data to be written to the phase change material, and thereby heating the phase change material to change its phase state. Data reading from the PRAM is performed by supplying current for data reading to the phase change material and measuring the resistance value thereof. The current for data reading should be low enough in comparison with that for data writing to prevent phase change of the phase change material.

The phase change material will not change its phase state unless high heat is applied thereto. Therefore, the data written in the PRAM will not be lost even if power supply is cut off. This means that the PRAM is a non-volatile memory.

When writing data, it is imperative to efficiently heat the phase change material with electric current. For this purpose, it is effective to restrict the path through which current flows to thereby concentrate the current flow to the phase change material. A description will be made of a conventional PRAM cell structure in which the current path is restricted in such a manner, with reference to FIG. 1.

A pair of memory cells shown in FIG. 1 has a phase-change layer 11 serving as a recording layer, and an upper electrode 12 and lower electrodes 13 arranged, respectively, on the top and the bottom of the phase-change layer 11 to supply current through and heat the phase-change layer 11. The phase-change layer 11 is formed of a phase change material such as chalcogenide (GST: germanium antimony tellurium).

The memory cells further has transistors (not shown) formed in a substrate 14 in a diffused manner to control the supply of current to the lower electrodes 13, gate electrodes 15 connected to gates of the transistors, series of contacts 16a and 16b connecting drains of the transistors to the lower electrodes 13, a ground wiring 17, and a series of contacts 18a and 18b connecting a common source of the transistors to the ground wiring 17.

Each of the lower electrodes 13 is formed in a cup shape (the upper edge of which has a ring shape), such that the lower electrode 13 is in contact with a phase-change layer 11 only at the upper edge thereof. This allows the current path to concentrate to the phase-change layer 11.

An oxide film 19 is formed between the phase-change layer 11 and a part of the lower electrode 13 to restrict the region where the lower electrode 13 is in contact with the phase-change layer 11 to another part of the upper edge thereof (a part in the circumferential direction thereof)(by employing a CFH (ConFined Hole) method), so that the current path is more concentrated to the phase-change layer 11 (see, for example, U.S. Patent Application Publication No. 2004/0012009; E. Varesi, A. Modelli, P. Besana, T. Marangon, F. Pellizzer, A. Pirovano, R. Bez, "Advances in Phase Change Memory Technology", EPCOS 2004 Conf. Proceedings; and S. Hudgens, B. Johnson, "Overview of Phase-Change Chalcogenide Nonvolatile Memory Technology", MRS Bulletin, November 2004).

In the conventional phase-change type semiconductor memory device, the contact region between the phase-change layer and the lower electrode is restricted by a method in which an oxide film is formed on a plane surface from which the upper edge of the lower electrode is exposed, and the oxide film is patterned to form a hole or groove for exposing a part of the upper edge of the lower electrode. The hole or groove formed in the oxide film is then filled with a phase change material to establish contact between the lower electrode and the phase-change layer.

When formed of chalcogenide, for example, the phase-change layer is formed by a sputtering method or the like. This may induce a problem that the film thickness becomes too thin in a step portion of the patterned oxide film, or a gap is formed between the phase-change layer and the oxide film or the lower electrode. Formation of a gap may lead to peel-off of the phase-change layer.

When employing the CFH (ConFined Hole) method, the phase-change layer is formed after formation of the oxide film. Therefore, there is nothing to restrict heat transfer above the phase-change layer, and heat is liable to dissipate upwards. This makes it necessary to require more flow of current in order to cause phase change of the phase-change layer.

Further, in the conventional phase-change type semiconductor memory device, the lower electrode for supplying current to the phase-change layer for heating the same has a cup shape. This means that the lower electrode has a large surface area, and the heat from the phase-change layer is liable to be dissipated due to heat discharge from the lower electrode.

SUMMARY OF THE INVENTION

It is therefore an object of the present invention to provide a semiconductor memory device which ensures stable formation of a phase-change layer, and is capable of reducing the current required to cause the phase change of the phase-change layer.

It is also an object of the present invention to provide a semiconductor memory device capable of efficiently heating the phase-change layer.

The present invention provides a semiconductor memory device having a phase-change layer provided between a lower electrode and an upper electrode, wherein the phase-change layer has a tapered portion located above the lower electrode, and the area of the uppermost flat surface of the phase-change layer is smaller than the area of the lower most flat surface of the phase-change layer.

The tapered portion may be located above a region where the lower electrode is in contact with the phase-change layer. The tapered portion may be filled with an oxide film.

In the semiconductor memory device described above, the lower electrode may have a shape defined by cutting off a part of a cup-shaped electrode in correspondence with the shape of the tapered portion of the phase-change layer.

The present invention also provides a method of manufacturing a semiconductor memory device having a phase-change layer provided between a lower electrode and an upper electrode, comprising the steps of: forming a flat surface of an insulation film from which a part of the lower electrode is exposed; forming a phase-change layer on the flat surface of the insulation film; and removing a part of the phase-change layer to form a tapered portion in the phase-change layer such that the tapered portion is located above the lower electrode.

The method of manufacturing a semiconductor memory device described above may further include a step of forming the upper electrode on the phase-change layer after the step of forming the phase-change layer, and the upper electrode may also be partially removed in the step of forming the tapered portion.

The method of manufacturing a semiconductor memory device described above may further include a step of filling the tapered portion with an oxide film.

In the method of manufacturing a semiconductor memory device described above, the step of forming the tapered portion may also remove a part of the lower electrode in correspondence with the shape of the tapered portion of the phase-change layer.

According to the present invention, the phase-change layer is provided with a tapered portion, whereby the contact region between the phase-change layer and lower electrode can be restricted without using an oxide film. Accordingly, the phase-change layer can be formed on a flat surface, and hence can be formed stably in a uniform thickness. This prevents the peel-off of the phase-change layer.

Further, according to the present invention, the tapered portion of the phase-change layer is provided above the region where the phase-change layer is in contact with the lower electrode. This restricts the region where the phase change is caused to occur by heating with the use of the lower and upper electrodes, and thus the electric current required for causing the phase-change can be reduced.

According to the present invention, the tapered portion is filled with an oxide film, whereby the prevention of peel-off of the phase-change layer is improved and the heat dissipation can be suppressed effectively.

Still further, according to the present invention, the lower electrode layer is formed into a shape defined by cutting off a part of the cup shape of the lower electrode in correspondence with the shape of the tapered portion of the phase-change layer. This makes it possible to suppress the heat dissipation from the lower electrode and to heat the phase-change layer even more efficiently.

BRIEF DESCRIPTION OF THE DRAWINGS

FIGS. 3A to 3I are diagrams for explaining respective steps of manufacturing the semiconductor memory device of FIGS. 2A and 2B.

DESCRIPTION OF THE PREFERRED EMBODIMENTS

Preferred embodiments of the present invention will be described with reference to the accompanying drawings.

Figure 1:
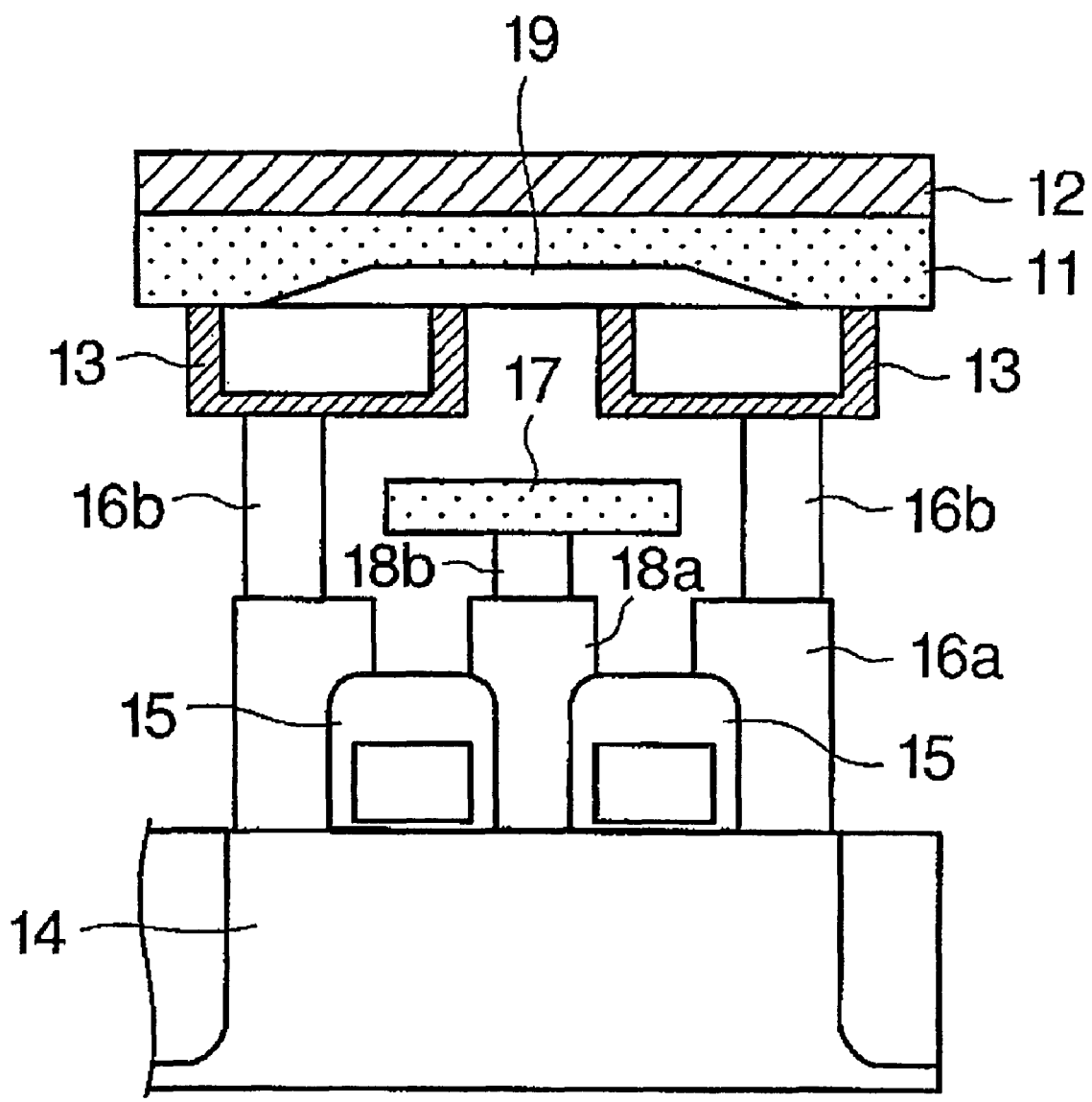
FIG. 1 is a longitudinal sectional view showing an example of a conventional PRAM cell structure.
Figure 2A:
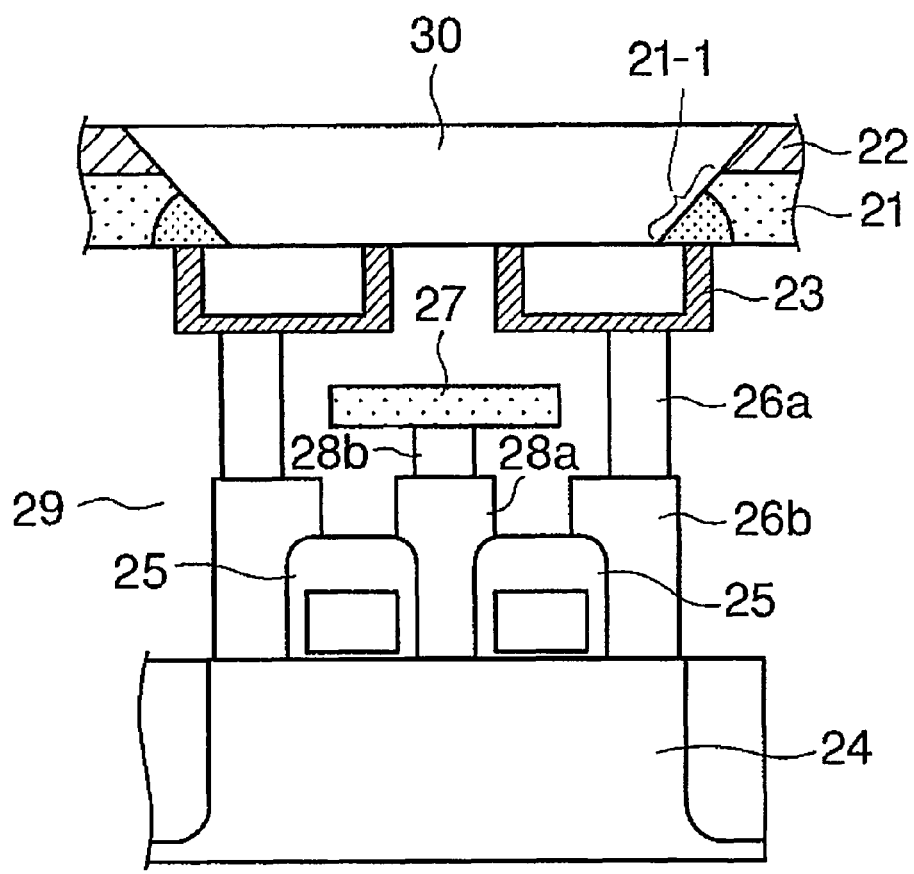
FIG. 2A is a longitudinal sectional view of a semiconductor memory device according to an embodiment of the present invention.
Figure 2B:
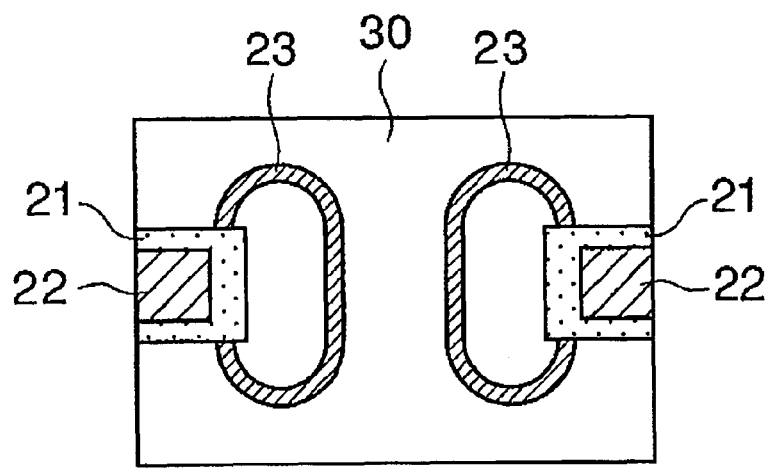
FIG. 2B is a plan view of the semiconductor memory of FIG. 2A.

FIG. 2A is a sectional view and FIG. 2B is a plan view of a semiconductor memory device according to an embodiment of the present invention.

As shown FIG. 2A, the semiconductor memory device according to this embodiment has a phase-change layer 21 formed of a film of a chalcogenide (GST) as a phase change material, and upper electrodes 22 and lower electrodes 23 for heating the phase-change layer 21 by supplying electric current through the phase-change layer 21.

The semiconductor memory device further has transistors (not shown) formed in a substrate 24 in a diffused manner for controlling the supply of current to the lower electrodes 23, gate electrodes 25 connected to gates of the transistors, series of contacts 26a and 26b for connecting drains of the transistors to the lower electrodes 23, a ground wiring 27, and a series of contacts 28a and 28b for connecting a common source of the transistors to the ground wiring 27.

Each of the lower electrodes 23 is formed into a cup shape, and the upper edge of the lower electrode 23 has a ring shape as shown in FIG. 2B.

The lower electrode 23 is used as a heater plug. This means that the lower electrode 23 serves as a part of a heating element during writing of data. Therefore, the lower electrode 23 is preferably formed of a material having relatively high electric resistance such as a metal silicide, a meta nitride, or a nitride of a metal silicide. Specifically, a high melting point metal or a nitride thereof such as W, TiN, TaN, WN or TiAlN, or a nitride of a high melting point metal silicide such as TiSiN, WSiN or TiCN may preferably be used as the material of the lower electrode 23.

As described above, the bottom surface of the lower electrode 23 is connected to a diffused region (the drain of the transistor) formed in an active region of the substrate 24 through the contacts 26a and 26b. Two gate electrodes 25 are provided on the substrate 24. This means that, according to this embodiment, two transistors are formed in one active region. These two transistors have the common source, which is connected to the ground wiring 27 through the contacts 28a and 28b provided in an interlayer insulation film 29.

The phase-change layer 21 has an edge portion 21-1 located above the lower electrode 23. This edge portion 21-1 forms a tapered portion having a slant face extending from the outer periphery of the upper electrode 22 located outside of a ring defined by the upper edge of the lower electrode 23 to the inside of the ring defined by the upper edge of the lower electrode 23. In other words, the phase-change layer 21 has a tapered portion formed above the region where the phase-change layer 21 is in contact with the lower electrode 23. This tapered portion is filled with an oxide film 30. The oxide film 30 is formed to fill the whole area shown in FIG. 2 except the phase-change layer 21.

The chalcogenide material used for the phase-change layer 21 is an alloy containing at least one or more elements among germanium (Ge), antimony (Sb), tellurium (Te), indium (In), selenium (Se), and the like. For example, the material may be an alloy of binary elements such as GaSb, InSb, InSe, $Sb_2Te_3$, and GeTe, an alloy of ternary elements such as $Ge_2Sb_2Te_5$, InSbTe, GaSeTe, $SnSb_2Te_4$, and InSbGe, and an alloy of quaternary elements such as AgInSbTe, (GeSn)SbTe, GeSb (SeTe), and $Te_{81}Ge_{15}Sb_2S_2$. The phase change material used for the phase-change layer 21 is not limited particularly but may be any material as long as the material is able to assume two or more phase states and has different electric resistance values depending on the phase states.

Referring to FIGS. 3A to 3I, a description will be made of a method of manufacturing the semiconductor memory device shown in FIGS. 2A and 2B. Formation of the transistors, the gate electrodes 25, the ground wiring 27, and the contacts 26a, 26b, 28a and 28b can be performed by a well-known method (standard process). Therefore, the description thereof will be omitted. The following description will be made on the assumption that a lower electrode is formed on a silicon substrate.

FIGS. 3A to 3I are sectional views for explaining primary steps for manufacturing the semiconductor memory device according to this embodiment.

As shown in FIG. 3A, a silicon oxide film is deposited on a silicon substrate 31 to form an interlayer insulation film 32.

The interlayer insulation film 32 is then patterned to form a contact hole 33 as shown in FIG. 3B.

As shown in FIG. 3C, a TiN film 34 is deposited so that a lower electrode 23 is defined by a part of the TiN film 34. Subsequently, as shown in FIG. 3D, an interlayer insulation film 35 formed of a silicon oxide film is deposited on the TiN film 34. The TiN film 34 deposited within the contact hole 33 assumes a cup shape.

The interlayer insulation film 35 and the TiN film 34 are then polished by a CMP (Chemical Mechanical Polishing) method from the top surface. This polishing is performed, as shown in FIG. 3E, such that only the cup-shaped portion of the TiN film 34 is left. The cup-shaped portion of the TiN film 34 is later utilized as the lower electrode 23.

Subsequently, a chalcogenide (e.g., GeSbTe) film 36 for later providing a phase-change layer 21 is deposited with a sputtering method. The surface on which the chalcogenide film 36 is formed is an even surface since it has been polished with the CMP method as described above. Therefore, the chalcogenide film 36 can be formed stably in a uniform thickness.

As shown in FIG. 3G, a tungsten film 37 is then formed so that a part of the tungsten film 37 later forms an upper electrode 22.

Subsequently, the tungsten film 37 and the chalcogenide film 36 are partially removed by a well-known selective etching method using a photoresist film or an etching mask. By this selective etching, the chalcogenide film 36 is formed with an edge with a tapered shape, or a tapered portion 36-1 as shown in FIG. 3H. To form the tapered shape of the chalcogenide film 36, reactive ion etching using mixes gas of $O_2$, Ar and HBr may be used, for instance. Because an edge of the etching mask can be gradually retreated by controlling etching conditions, the tapered shape can be made. The tapered portion 36-1 is formed such that the upper electrode 22 is located outside of a ring defined by the upper edge of the lower electrode 23 as shown by a right arrow and that the bottom surface of the chalcogenide film 36 is located inside of the ring as shown by a left arrow. In other words, the tapered portion 36-1 is formed to be located above a region where the lower electrode 23 is in contact with the chalcogenide film 36 (such that the slant face thereof is located above the contact region).

Finally, as shown in FIG. 3I, an oxide film 38 is formed in a region where the tungsten film 37 and the chalcogenide film 36 have been removed by the selective etching to fill the tapered portion 36-1 of the chalcogenide film 36.

In the semiconductor memory device according to this embodiment as described above, the base on which the chalcogenide film 36 is formed has an even surface, and hence the chalcogenide film 36 which is uniformly thin can be applied thereto in a stable manner. This stabilizes the characteristics of the semiconductor memory device as a phase-change memory.

By tapering the edge portion 36-1 (21-1) of the chalcogenide film 36 (21) above the cup-shaped portion of the TiN film 34 (or the lower electrode 23), the current path can be restricted and the region where phase-change occurs (the region hatched in a different manner in FIG. 3I (2A)) can also be restricted. Further, not only the volume of the part of the chalcogenide film 36 where the phase-change occurs can be reduced, but also heat dissipation in the upward direction can be suppressed. Therefore, the chalcogenide film 36 (21) can be heated efficiently and the electric current requiring for heating the same can be reduced.

A semiconductor memory device according to another embodiment will be described with reference to FIGS. 4A to 4C.

Figure 4C:
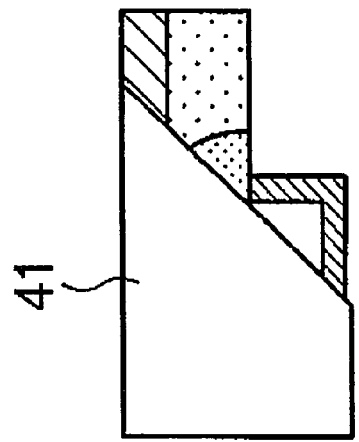
FIGS. 4A to 4C are diagrams for explaining respective steps of manufacturing a semiconductor memory device according to another embodiment of the present invention.
Figure 4B:
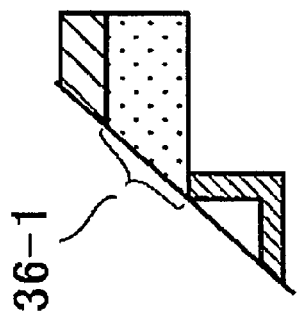
Figure 4A:
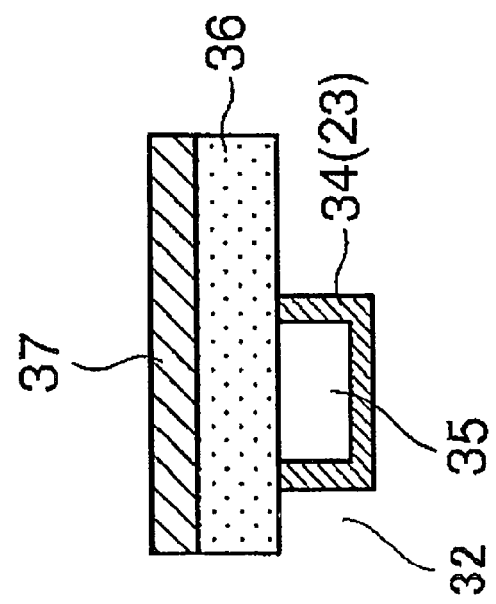

FIGS. 4A to 4C are sectional views for explaining respective steps for manufacturing the semiconductor memory device according to the second embodiment.

FIG. 4A shows the same state as FIG. 3G. This means that the same steps are performed as those shown in FIGS. 3A to 3G until the formation of the tungsten film 37.

Subsequently, as shown in FIG. 4B, the tungsten film 37 and the chalcogenide film 36 are partially removed by a well-known selective etching method to form a tapered portion 36-1 in the chalcogenide film 36. Further, the cup-shaped portion of the TiN film 34 (or the lower electrode 23) and the interlayer insulation film 35 (and 32) are then selectively partially removed so as to be substantially flush with the slant face of the tapered portion 36-1 of the chalcogenide film 36. This removes the part of the lower electrode which has become unnecessary by the tapering of the edge portion of the chalcogenide film 36. To etch the TiN film 34 and the interlayer insulation film 35, etching gas of $CF_4$, $CHF_3$ or Ar—HBr may be used in the reactive ion etching. An edge of an etching mask for etching the TiN film 34 and the interlayer insulation film 35 can be gradually retreated by controlling etching conditions and thereby a tapered shape can be made.

Finally, as shown in FIG. 4C, an oxide film 41 is formed in the region where the tungsten film 37, the chalcogenide film 36, the TiN film 34 (or the lower electrode 23), and the interlayer insulation film 35 have been removed by the selective etching, so that the tapered portion 36-1 is filled with the oxide film 41.

According to the second embodiment as described above, further advantageous effects can be obtained in addition to the above-mentioned effects by removing the unnecessary part of the lower electrode. Specifically, the heat dissipation from the lower electrode can be suppressed and the efficiency of heating the chalcogenide film 36 can be improved further more.

What is claimed is:

1. A semiconductor memory device comprising:
    a phase-change layer provided between a lower electrode and an upper electrode,
    wherein the phase-change layer has a tapered portion located above the lower electrode, and an area of an uppermost flat surface of the phase-change layer is less than an area of a lower most flat surface of the phase-change layer, and
    wherein the lower electrode comprises a ring shape in a plan view, the tapered portion of the phase-change layer being inclined in a direction away from an inside of the ring shape and toward an outside of the ring shape and including a part which is formed over the ring shape in the plan view.

2. The semiconductor memory device according to claim 1, wherein the tapered portion is located above a region where the lower electrode is in contact with the phase-change layer.

3. The semiconductor memory device according to claim 1, wherein the tapered portion is filled with an oxide film.

4. The semiconductor memory device according to claim 3, wherein the lower electrode comprises a cup-shaped electrode and includes a tapered portion having a shape which is defined by cutting off a part of the cup-shaped electrode, the shape of the tapered portion of the lower electrode being the same as a shape of the tapered portion of the phase-change layer.

5. The semiconductor memory device according to claim 1, wherein the lower electrode comprises a cup-shaped electrode and includes a tapered portion having a shape which is defined by cutting off a part of the a cup-shaped electrode, the shape of the tapered portion of the lower electrode being the same as a shape of the tapered portion of the phase-change layer.

6. The semiconductor memory device according to claim 5, wherein the phase-change layer comprises a chalcogenide.

7. The semiconductor memory device according to claim 1, wherein the phase-change layer comprises a chalcogenide.

8. The semiconductor memory device according to claim 3, wherein the phase-change layer comprises a chalcogenide.

9. The semiconductor memory device according to claim 4, wherein the phase-change layer comprises a chalcogenide.

10. A semiconductor memory device, comprising:
a lower electrode which has a cup shape;
a phase-change layer disposed on the lower electrode and connected to a part of a top surface of the lower electrode; and
an upper electrode disposed on a top surface of the phase-change layer,
wherein the phase-change layer has a side surface between the lower electrode and the upper electrode, and a part of the side surface being located above the lower electrode has a tapered shape, and
wherein the lower electrode comprises a ring shape in a plan view, the tapered shape of the side surface of the phase-change layer being inclined in a direction away from an inside of the ring shape and toward an outside of the ring shape and including a part which is formed over the ring shape in the plan view.

11. The semiconductor memory device according to claim 10, further comprising:
a first insulation layer, the lower electrode being disposed in the first insulation layer, and the top surface of the lower electrode being exposed at a top surface of the first insulation layer; and
a second insulation layer disposed on the first insulation layer,
wherein the tapered shape side surface of the phase-change layer is covered by the second insulation layer.

12. The semiconductor memory device according to claim 11, wherein the second insulation layer has a plane top surface, a level of a top surface of the upper electrode and a level of the top surface of the second insulation layer being substantially same.

13. The semiconductor memory device according to claim 10, wherein the top surface of the lower electrode has the ring shape in plan view, the phase-change layer being extended to an outward direction from an outer edge of the ring shape in plan view.

14. The semiconductor memory device according to claim 1, wherein the tapered portion of the phase-change layer includes another part which is formed inside the ring shape in the plan view.

15. The semiconductor memory device according to claim 1, wherein the upper electrode comprises an edge portion which is formed outside the ring shape in the plan view and contacts the tapered portion of the phase-change layer.

16. The semiconductor memory device according to claim 1, wherein the upper electrode comprises a tapered portion, a shape of the tapered portion of the upper electrode being the same as a shape of the tapered portion of the phase-change layer.

17. The semiconductor memory device according to claim 16, wherein the lower electrode comprises a cup-shaped lower electrode, and
wherein the memory device further comprises an insulation film formed in the cup-shaped lower electrode, the tapered portion of the phase-change layer being formed on a surface of the insulation film and extending from the surface of the insulation film to the tapered portion of the upper electrode.

18. The semiconductor memory device according to claim 17, wherein the cup-shaped lower electrode comprises a bottom portion and a wall portion formed perpendicular to the bottom portion, the tapered portion of the phase-change layer being formed over the wall portion of the cup-shaped lower electrode.

19. The semiconductor memory device according to claim 16, wherein the tapered portion of the phase-change layer is aligned with the tapered portion of the upper electrode.

20. The semiconductor memory device according to claim 1, wherein a region of the phase-change layer where phase change occurs is formed between the tapered portion of the phase-change layer and the lower electrode.

* * * * *